US008374573B1

(12) United States Patent
Potter, Sr.

(10) Patent No.: US 8,374,573 B1
(45) Date of Patent: Feb. 12, 2013

(54) AVI SYSTEM WITH IMPROVED RECEIVER SIGNAL PROCESSING

(75) Inventor: Thomas R. Potter, Sr., Reno, NV (US)

(73) Assignee: Reno A & E, Reno, NV (US)

( * ) Notice: Subject to any disclaimer, the term of this patent is extended or adjusted under 35 U.S.C. 154(b) by 503 days.

(21) Appl. No.: 12/383,872

(22) Filed: Mar. 30, 2009

(51) Int. Cl.
*H05K 11/02* (2006.01)

(52) U.S. Cl. .............. 455/345; 455/73; 455/78; 455/99; 340/905; 340/941

(58) Field of Classification Search .................... 455/41, 455/54, 55, 99, 78, 227, 228, 345; 340/902, 340/903, 904, 905, 991, 992, 993, 996, 989, 340/825.54, 825.71, 941
See application file for complete search history.

(56) References Cited

U.S. PATENT DOCUMENTS 4,731,867 A 3/1988 Seabury et al.
4,996,716 A 2/1991 Potter et al.
5,089,815 A 2/1992 Potter et al.
5,198,811 A * 3/1993 Potter et al. .................. 340/905
5,617,320 A * 4/1997 Petersen et al. ............... 701/509
6,128,572 A * 10/2000 Suzuki .......................... 701/530

* cited by examiner

*Primary Examiner* — Shawki Ismail
*Assistant Examiner* — Christopher Lo

(57) ABSTRACT

An automatic vehicle identification (AVI) system signal processing technique which provides improved performance and reliability and which substantially eliminates the adverse effect of ambient noise signals on the detection of permissible code sequences by an AVI receiver. Input signals to an AVI receiver are filtered to strip off all frequency components except those at the carrier frequency. The filtered signals are subjected to variable gain amplification over a substantially linear operating range with the maximum amplitude of the amplified signals limited to a maximum value below the supply voltage and within the linear range of the variable gain amplifier. The amplified signals are converted to a binary pulse train signifying the temporal length of each active carrier period and the temporal length of each quiescent carrier period. The binary pulse train is decoded and a valid vehicle signal is generated if the decoded binary pulse train matches a permissible code sequence.

22 Claims, 2 Drawing Sheets

AVI SYSTEM WITH IMPROVED RECEIVER SIGNAL PROCESSING

BACKGROUND OF THE INVENTION

This invention relates to automatic vehicle identification (AVI) systems used to detect a specific vehicle over an inductive loop embedded in a roadbed. More particularly, this invention relates to a technique for improving the performance and reliability of such systems.

AVI systems have been used for a substantial period of time to generate information specifying the presence or absence of a specific vehicle at a particular location sometimes termed a detection zone and to control access to restricted areas, such as an area providing restricted access via an automatically operated gate. Such systems have been used, for example, to limit ingress and egress at police impound lots to only authorized vehicles, to enable emergency vehicles (such as fire trucks and ambulances) to gain access to a gated residential or industrial area, and to monitor the progress of omnibuses along a city route.

A typical AVI system has a transmitter mounted on a vehicle which broadcasts over a limited range an encoded signal, usually a modulated carrier signal at a predetermined specific frequency (e.g., 375 kHz.), serving to identify the vehicle. A receiver connected to a loop antenna detects signals sensed at the specific frequency when a vehicle having such a transmitter is within the detection range of the loop-receiver combination. The receiver processes the detected signal to recover the encoded information, determines whether the encoded information matches a permissible code sequence stored in the receiver (which specifies a vehicle authorized in the system), and generates appropriate supervisory and control signals depending on the result of this determination. For example, in a system application in which access to a gate-guarded area is controlled by a receiver, the receiver may generate a gate operating signal in response to a match between the encoded information detected by the receiver and the permissible code sequence stored in the receiver. In a vehicle progress monitoring application, the receiver may time stamp the passage of the specific vehicle through the loop and store this time information and the identity of the vehicle in a local memory or transmit this information to a central processing unit, either instantaneously or on a periodical batch processing basis.

In a typical U.S. AVI system, information is encoded on a single frequency carrier signal by carrier burst modulation using a serial bit trinary encoding technique. According to this trinary encoding technique, a bit clock having a period of 0.1706 msec. Is used to define a bit period of 0.68250 msec. (four bit clock cycles); a trinary bit period of 1.3650 msec consisting of two consecutive bit periods. (eight bit clock cycles), and a nine bit trinary sequence of 12.285 msec (seventy-two bit clock cycles). The bit clock is also used to define two different types of bits—a short bit and a long bit. A short bit is defined as a binary signal asserted for the duration of one-half of a bit clock cycle (0.08530 msec.). A long bit is defined as a binary signal asserted for the duration of three and one-half cycles of the bit clock (0.59720 msec.). A ZERO value is defined as a two short bits during a trinary bit period consisting of a short bit at the beginning of a bit period followed by another short bit at the beginning of the next consecutive bit period. A ONE value is defined as two long bits during a trinary bit period consisting of a long bit at the beginning of a bit period followed by another long bit at the beginning of the next consecutive bit period. A TWO value is defined as one long bit followed by one short bit during a trinary bit period consisting of a long bit at the beginning of a bit period followed by a short bit at the beginning of the next consecutive bit period. In a nine bit trinary sequence, the least significant bit is transmitted first, followed by the next most significant bit, etc., until the most significant bit has been transmitted. The order of the bits is weighted according to the trinary encoding system, so that a transmitted value of ONE for the first trinary bit in the trinary sequence (bit 0) is interpreted as ONE, and a transmitted value of TWO for trinary bit 0 is interpreted as TWO; a transmitted value of ONE for the second trinary bit in the trinary sequence (bit 1) is interpreted as THREE, a transmitted value of TWO for trinary bit 1 is interpreted as SIX; etc. (For the last trinary bit in the trinary sequence [bit 8], a transmitted value of ONE is interpreted as 6561, and a transmitted value of TWO is interpreted as 13,122). As an example, to transmit a permissible code sequence of 13, 762, the sequence of transmitted values, beginning with the least significant bit, is ONE, ZERO, TWO, TWO, ONE, TWO, ZERO, ZERO, TWO.

The binary code values are encoded on a single frequency carrier in the following manner. A zero is signified by a short carrier burst followed by a short carrier burst; a one is signified by a long carrier burst followed by a long carrier burst; and a two is signified by a long carrier burst followed by a short carrier burst. The timing and positioning of the carrier bursts follow precisely the timing and sequencing constraints noted above. Each trinary sequence is separated from the next by a guard band consisting of a time period during which the carrier is inactive.

An AVI receiver determines the numerical value of a valid received code by adding the values for the trinary bit sent at each bit position in the trinary sequence using the weighting factors noted above. In order to validate the reception of a permissible code sequence, known AVI receivers are designed to require that the identical code sequence be decoded from two or more successive received trinary sequences.

In many loop locations, ambient electro-magnetic radiation can be present, either continuously or sporadically. This radiation is usually referred to as electrical noise signals, or simply noise signals. Some of these noise signals can contain a frequency component having the same frequency as the frequency of the AVI carrier signal generated by AVI transmitters. Given the precise timing constraints resident in the standard AVI trinary encoding process, the presence of such ambient noise signals at the AVI carrier frequency can adversely affect the operation of the AVI detection system, since the AVI receiver must be configured to detect all signals at the predetermined specific frequency. If present at a given loop, these carrier frequency noise signals will pass through the AVI receiver processing circuitry (since it must accept signals at the carrier frequency). The AVI receiver will attempt to process these noise signals, usually with a negative result—e.g., no comparison match with a permissible code sequence. These carrier frequency noise signals can possess sufficient amplitude to mask a permissible code sequence encoded in the carrier frequency. When the carrier frequency noise signals appear at the receiver during the same time as the carrier frequency signals, the AVI system cannot detect and take appropriate action in response to the arrival of an authorized vehicle at the loop. In the case of a fire truck responding to an emergency call in a gate-guarded community, for example, the AVI receiver can fail to generate the necessary gate operating control signal, thus denying the fire truck immediate access to the secured area. In the case of a bus route monitoring application, the AVI receiver can fail to detect the passage of a particular bus, resulting in the loss of important bus location information.

Efforts to devise an AVI system devoid of the above noted disadvantages have not met with success to date.

SUMMARY OF THE INVENTION

The invention comprises an AVI system signal processing technique providing improved performance and reliability in the presence of ambient noise signals. This improved performance and operation affords reliable receiver operation in the presence of electrical noise.

In a broadest apparatus aspect, the invention comprises an automatic vehicle identification (AVI) receiver for processing signals received thereby to recover information encoded in carrier frequency signals generated by a transmitter at a specific frequency for the purpose of identifying an authorized vehicle. The receiver comprises an input terminal adapted to be coupled to an inductive loop, which defines a detection zone, for receiving signals from the loop a filter unit coupled to the input terminal for permitting signals at the specific frequency present on the input terminal to pass therethrough and for substantially attenuating all other frequency components of signals present on the input terminal, the filter unit having an output; a variable gain amplifier having an input coupled to the output of the filter unit for amplifying signals input thereto and for limiting the amplitude of signals amplified thereby to a maximum value, the variable gain amplifier having a gain control signal input and an output, the variable gain amplifier having an operating range with a substantially linear portion; an amplitude detection circuit having an input coupled to the output of the variable gain amplifier and a gain control signal output coupled to the gain control input of the variable gain amplifier for sensing the amplitude of signals received from the variable gain amplifier and for generating a gain control signal for controlling the gain of the variable gain amplifier so that so that the signals input to the variable gain amplifier are operated on within the substantially linear portion and the amplitude of signals amplified by the variable gain amplifier are limited to the maximum value; a carrier-to-pulse conditioning circuit having an input coupled to the output of the variable gain amplifier for converting carrier frequency signals present at the output of the variable gain amplifier to a binary pulse train signifying the temporal length of each active carrier period and the temporal length of each quiescent carrier period, the carrier-to-pulse conditioning circuit having an output; and a decoder unit having an input coupled to the output of the carrier-to-pulse conditioning circuit for generating an authorized vehicle signal when the binary signal train matches a permissible code sequence contained in the decoder unit, the decoder unit having an output for manifesting the authorized vehicle signal.

The filter unit preferably comprises a multi-stage tuned filter circuit having a narrow pass band centered on said specific carrier frequency.

The maximum value to which the amplified signals are limited is selected to be less than the supply voltage for the receiver, and is preferably selected to be a value which lies within the linear operating range of the variable gain amplifier.

The gain control signal generated by the gain control circuit preferably enables the variable gain amplifier to operate at maximum gain in the absence of any carrier frequency signals input thereto.

The carrier-to-pulse conditioning circuit preferably includes biasing means for establishing a trigger threshold for input carrier frequency signals, and binary level circuitry for establishing the signal on the output of the carrier-to-pulse conditioning circuit at a first binary level when the carrier frequency input signal rises above the trigger threshold at the beginning of an active carrier period and for establishing the signal on the output of the carrier-to-pulse conditioning circuit at a second binary level when the carrier frequency input signal falls below the trigger threshold at the end of an active carrier period.

The binary level circuitry preferably includes a first comparator having a first input coupled to the biasing means, a second input for receiving the input carrier frequency signals, and an output; a second comparator having a first input coupled to the output of the first comparator, a second input coupled to the biasing means, and an output; a switching transistor having a control input coupled to the output of the second comparator and an output element serving as the output of the carrier-to-pulse conditioning circuit; and an R-C circuit having a capacitor coupled between ground and the first input of the second comparator and a resistor coupled between the first input of the second comparator and supply voltage.

The binary level circuitry further preferably includes a second R-C circuit coupled between the output of the second comparator and the first input of the first comparator for preventing small carrier frequency noise signals from affecting the operation of the first comparator.

The receiver also may further include an amplifier coupled to the output of the variable gain amplifier for establishing a quiescent value for signals output from the variable gain amplifier.

In a broadest process aspect, the invention comprises a method of processing signals received by an automatic vehicle indicator (AVI) receiver to recover information encoded in carrier frequency signals generated at a specific frequency by a transmitter and identifying an authorized vehicle, the method comprising the steps of:

(a) filtering signals received by the receiver to permit signals at the specific frequency to pass for further processing and for substantially attenuating all other frequency components of received signals;

(b) providing a reference supply voltage;

(c) processing the signals filtered in step (a) with a variable gain amplifier having an operating range with a substantially linear portion to produce amplified carrier frequency signals operated on within the substantially linear portion and having a maximum amplitude limited to a maximum value lower than the reference supply voltage; and (d) converting the amplified signals from step (c) to a binary pulse train signifying the temporal length of each active carrier period and the temporal length of each quiescent carrier period.

The method further preferably includes the steps of:

(e) providing a permissible code sequence in the receiver and;

(f) generating an authorized vehicle signal when the binary signal train matches the permissible code sequence.

The step (a) of filtering preferably includes the step of passing the signals received by the receiver through a multi-stage tuned filter circuit having a narrow pass band centered on said specific carrier frequency.

The step (c) of processing preferably includes the step of enabling maximum gain amplification in the absence of any carrier frequency signals The step (d) of converting preferably includes the steps of:

(i) establishing a first trigger threshold for carrier frequency signals amplified in step (c), and;

(ii) generating a binary signal at a first level when the amplified signal rises above the first trigger threshold at the beginning of an active carrier period and generating a binary signal at a second level when the amplified signal falls below the first trigger threshold at the end of an active carrier period. The first trigger threshold is established at a value less than the value of the maximum amplitude.

The step (ii) of generating preferably includes the steps of initially charging a capacitor through a resistor coupled to the supply reference voltage, discharging the capacitor when the amplified signal rises above the first trigger threshold at the beginning of an active carrier period, permitting the capacitor to charge at a rate determined by the time constant of the resistor and capacitor, establishing a second trigger threshold, discharging the capacitor if the amplified signal again rises above the first trigger threshold before the capacitor is charged to the second trigger threshold, and generating the binary signal at the second level when the capacitor is charged to the second threshold level before the amplified signal rises above the first trigger threshold. The time constant of the resistor and capacitor is at least greater than the time length of one cycle of the amplified signal.

The step (ii) of generating preferably includes the step of preventing any small noise components present in the amplified signal from influencing the generation of the binary signal.

The AVI receiver incorporating the invention processes the carrier frequency signals input thereto in such a manner that the binary pulse train generated by the carrier-to-pulse conditioning circuit faithfully replicates any information encoded on a carrier signal by the associated AVI transmitter, even in the presence of noise signals at the carrier frequency. The combined operation of the variable gain amplifier and the amplitude detection circuit ensures that the maximum amplitude of the carrier frequency signals processed by the variable gain amplifier will be maintained at a constant value less than supply voltage and that the variable gain amplifier will operate on the incoming carrier signals essentially over the linear range of the variable gain amplifier. This in turn assures that the duration of the active carrier intervals and the passive carrier intervals (i.e., the ON time and the OFF time of the incoming carrier signals) will be faithfully replicated in the binary signal generated by the carrier-to-pulse conditioning circuit.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
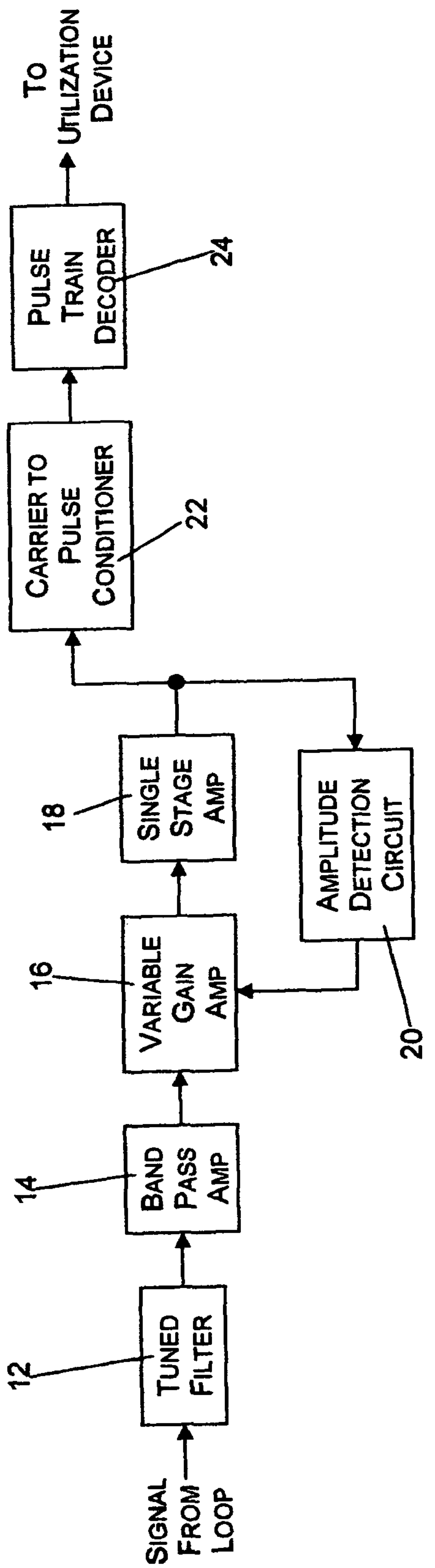
FIG. 1 is a block diagram of an embodiment of an AVI receiver incorporating the invention.
Figure 2:
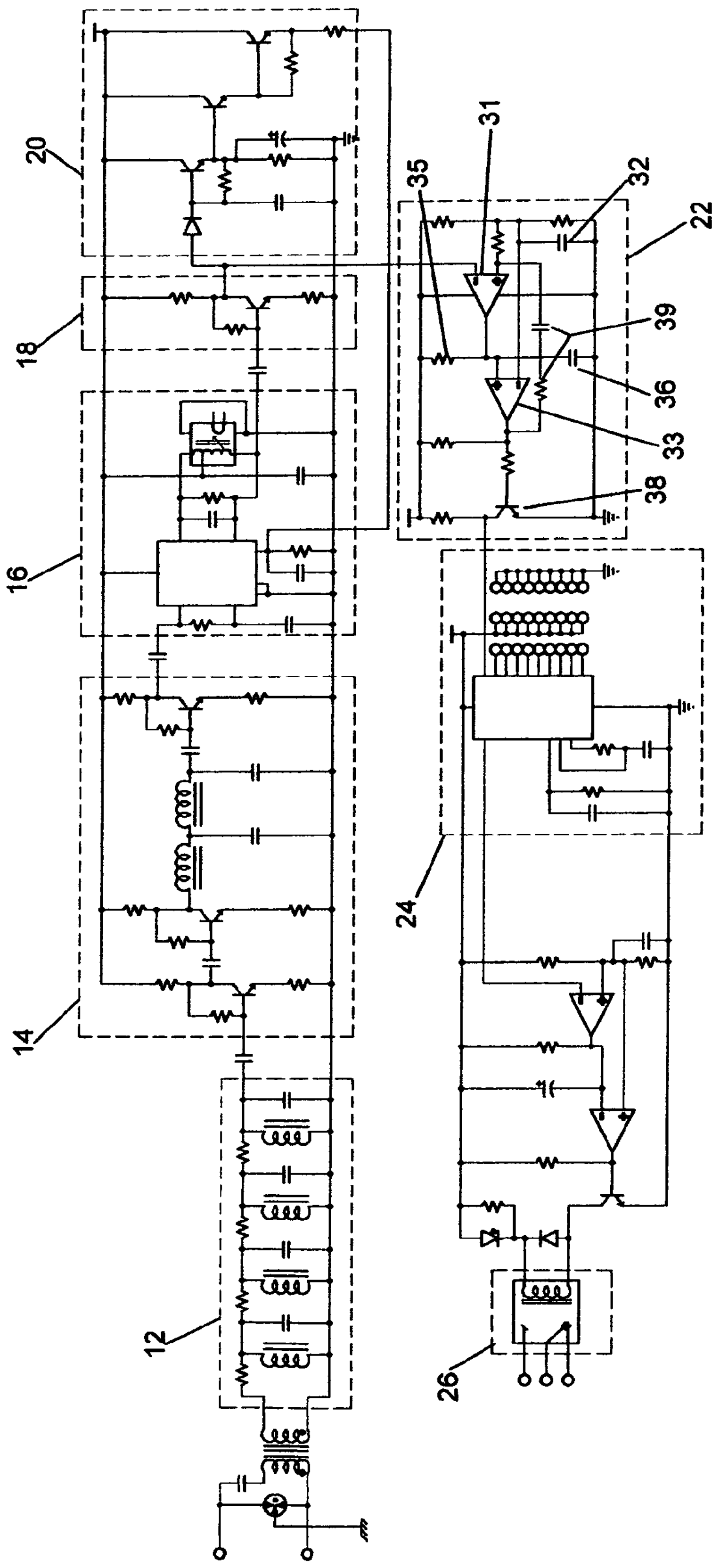
FIG. 2 is a circuit diagram of the specific embodiment of the AVI receiver illustrated in block diagram form in FIG. 1.

Turning now to the drawings, FIG. 1 is a block diagram of an embodiment of an AVI receiver 10 incorporating the invention, while FIG. 2 is a circuit diagram of the specific embodiment of the AVI receiver illustrated in block diagram form in FIG. 1. As seen in FIG. 1, incoming signals from a loop coil (not illustrated) are coupled to the signal input of a tuned filter 12. As best seen in FIG. 2, the tuned filter 12 in the specific embodiment is a four stage tuned filter circuit which comprises the circuit elements located within the region enclosed by broken lines designated by reference numeral 12. Tuned filter 12 attenuates all frequency components present in the incoming signals other than those at the carrier frequency (e.g., 375 kHz). The filtered carrier frequency signals present at the output of tuned filter 12 are coupled to the input of a band pass amplifier 14 comprising the circuit components located within the region enclosed by broken lines designated by reference numeral 14 in FIG. 2. Band pass amplifier 14 provides signal gain while preserving the relatively steep leading and trailing edge characteristics of the tuned filter 12. The amplified carrier frequency signals present at the output of band pass amplifier 14 are coupled to the input of a variable gain amplifier 16 comprising the circuit components located within the region enclosed by broken lines designated by reference numeral 16 in FIG. 2. Variable gain amplifier 16 preferably includes a type MC1350 monolithic IF amplifier available from Motorola, Inc. The circuit parameters of variable gain amplifier 16 are selected such that variable gain amplifier 16 operates at maximum gain in the absence of any input signal. The carrier frequency signals present at the output of variable gain amplifier 16 are coupled to the input of a single stage amplifier 18 comprising the circuit components located within the region enclosed by broken lines designated by reference numeral 18 in FIG. 2. Amplifier 18 establishes a quiescent D.C. value for signals output from variable gain amplifier 16. In the specific embodiment of FIG. 2, amplifier 18 is configured to generate signals at 4.0 volts when in the quiescent state. When active carrier frequency signals are input to amplifier 18, the output signals swing above and below this 4.0 volts value. The carrier frequency signals present at the output of single stage amplifier 18 are coupled along a first signal path to the input of an amplitude detection circuit 20 comprising the circuit components located within the region enclosed by broken lines designated by reference numeral 20 in FIG. 2. Amplitude detection circuit 20 generates a gain feedback signal from the carrier frequency signals received from single stage amplifier 18. The gain feedback signal is coupled to the gain control input of variable gain amplifier 16.

The circuit parameters of amplitude detection circuit 20 are selected to ensure that the gain feedback signal generated thereby will force the variable gain amplifier 16 to maintain the maximum amplitude of the carrier frequency signals at a predetermined value less than the supply voltage and lying within the linear range of the variable gain amplifier 16. For the specific embodiment illustrated in FIG. 2, this maximum amplitude is essentially 7.0 volts for a supply voltage of 9.0 volts.

The carrier frequency signals present at the output of single stage amplifier 18 are coupled along a second signal path to the input of a carrier-to-pulse conditioning circuit 22 comprising the circuit components located within the region enclosed by broken lines designated by reference numeral 22 in FIG. 2. Carrier-to-pulse conditioning circuit 22 converts the carrier frequency signals supplied thereto to a binary signal train in the following manner. The signal output from amplifier 18 is coupled to the inverting input of a first comparator 31. The non-inverting input of comparator 31 is biased to a trigger threshold value below the maximum amplitude maintained by variable gain amplifier 16 (i.e., the 7.0 volts in the example above). In the preferred embodiment, the threshold value established by the bias applied to the non-inverting input of first comparator 31 is essentially two-thirds of the supply voltage (6.0 volts for a supply voltage of 9.0 volts). A capacitor 32 is coupled between the non-inverting input of first comparator 31 and ground to remove any ripple from the bias voltage applied to this input. The output of first comparator 31 is coupled to the non-inverting input of a second comparator 33. The non-inverting input of second comparator 33 is coupled to supply voltage via a charging resistor 35. A capacitor 36 is coupled between the non-inverting input of second comparator 33 and ground. The time constant of charging resistor 35 and capacitor 36 is selected to be at least as long as the period of the carrier frequency. In the specific embodiment of FIG. 2, this time constant is about 3.9 μsecs., which is about 1½ cycles of a carrier frequency signal of 375 kHz. The inverting input of second comparator 33 is biased to the same reference voltage value as the non-inverting input of first comparator 31. The output of second comparator 33 is coupled to the base input of a transistor 38. The output of second comparator 33 is also coupled to a series connected R-C feedback network 39, the other end of which is coupled to the non-inverting input of first comparator 31. The time constant of network 39 is selected to be as long as a few cycles of the carrier frequency. In the specific embodiment of FIG. 2, the time constant is 10 μsecs, which is about four cycles of a carrier frequency signal of 375 kHz. The collector terminal of transistor 38 functions as the output terminal of carrier-to-pulse conditioning circuit 22 and is coupled to the input of a decoder described below.

In the quiescent state, when no carrier frequency signals are presented to the inverting input of first comparator 31 the output of first comparator 31 is open (HIGH). The non-inverting input of second comparator 33 is held HIGH by the voltage on capacitor 36 and the output of second comparator 33 is also open (HIGH). Transistor 38 is switched ON and the signal on the collector output is LOW. When a carrier frequency signal above the trigger threshold is first presented to the inverting input of first comparator 31, the output of comparator 31 transitions LOW which causes the output of second comparator 33 to transition LOW. Transistor 38 is switched off and the signal on the collector output transitions HIGH. When the output of first comparator transitions LOW, capacitor 36 is discharged and begins to charge through charging resistor 35. When the signal on the collector output of transistor 38 transitions HIGH, R-C feedback network 39 forces the level of the bias voltage applied to the non-inverting input to first comparator 31 to a lower value (4.0 volts in the specific embodiment of FIG. 2). This eliminates any switching effect which might be caused by a small noise transition below the normal trigger threshold (6.0 volts). When the level of the carrier frequency input signal drops below the trigger threshold, first comparator 31 changes state and the output transitions open (HIGH), but the level of the reference signal applied to the non-inverting input of second comparator 33 is controlled by the voltage on capacitor 36 (LOW) so that second comparator 33 remains in the same state with a LOW output. Transistor 38 remains in the switched off state and the signal on the collector output remains HIGH. If the carrier frequency signal at the inverting input to first comparator 31 exceeds the trigger threshold before the voltage on capacitor 36 rises to the switching threshold of second comparator 33, capacitor 36 is again discharged, the state of second comparator 33 remains unchanged, and the collector output of transistor 38 remains HIGH. This condition persists until the carrier frequency signal at the inverting input to first comparator 31 fails to exceed the trigger threshold before the voltage on capacitor 36 is allowed to rise to the switching threshold of second comparator 33. When this occurs (the carrier burst has terminated), second comparator 33 is switched to the opposite state with an open (HIGH) output, and the collector output of transistor 38 transitions LOW. When the next carrier burst begins, the carrier frequency signals are processed in the manner described above, with the result that the collector output of transistor 38 generates a binary signal train which signifies the temporal length of each active carrier burst and the temporal length of each quiescent carrier period between bursts. If the carrier frequency signals processed this far by the receiver are valid encoded carrier frequency signals generated by a transmitter, the binary signal train replicates the information encoded in the input carrier frequency signals.

The binary signal train present at the output of carrier-to-pulse conditioning circuit 22 is coupled to the input of a conventional pulse train decoder 24 comprising the circuit components located within the region enclosed by broken lines designated by reference numeral 24 in FIG. 2. Pulse train decoder 24 preferably includes a type MC 145028 decoder chip available from Motorola, Inc. Pulse train decoder 24 examines the binary pulse train and compares it with permissible code sequence information, which may comprise a single permissible code sequence or a plurality of permissible code sequences. If the binary signal train presented to pulse train decoder 24 is recognized as a permissible code sequence, pulse train decoder 24 generates appropriate control and/or information signals for a follow-on utilization device. For example, FIG. 2 illustrates a utilization device in the form of a relay 26, which can be used to provide an operating signal for a gate operating mechanism for a gate controlled area. (such as an impound lot).

The AVI receiver 10 incorporating the invention processes the carrier frequency signals input thereto in such a manner that the binary pulse train generated by the carrier-to-pulse conditioning circuit 22 faithfully replicates any information encoded on a carrier signal by the associated AVI transmitter, even in the presence of noise signals at the carrier frequency. The combined operation of the variable gain amplifier 16 and the amplitude detection circuit 20 ensures that the maximum amplitude of the carrier frequency signals processed by the variable gain amplifier 16 will be maintained at a constant value less than supply voltage and that the variable gain amplifier will operate on the incoming carrier signals essentially over the linear range of the variable gain amplifier 16. This in turn assures that the duration of the active carrier intervals and the passive carrier intervals (i.e., the ON time and the OFF time of the incoming carrier signals) will be faithfully replicated in the binary signal generated by the carrier-to-pulse conditioning circuit 22.

In operation, as the associated AVI transmitter approaches the loop, the amplitude of the valid encoded carrier frequency signals increases. When the amplitude of the encoded carrier frequency signals reaches the maximum permitted threshold value, amplitude detection circuit 20 generates a gain feedback signal which results in a reduction of the gain of variable gain amplifier 16 so as to maintain the maximum amplitude of the signals output from variable gain amplifier 16 to the maximum permitted value. This reduces the amplitude of both the valid encoded carrier frequency signals and any concurrently present carrier frequency noise signals. As the amplitude of the valid encoded carrier frequency signals continues to rise (as the vehicle-mounted transmitter approaches closer to the loop), the gain reduction signal generated by amplitude detection circuit 20 causes further reduction of the gain of variable gain amplifier 16, which further reduces the amplitude of any carrier frequency noise signals. Eventually, the magnitude of the valid encoded carrier frequency signals will be so much greater than that of the carrier frequency noise signals that the gain reduction applied to variable gain amplifier 16 will result in the reduction of the magnitude of any carrier frequency noise signals below the trigger threshold of carrier-to-pulse conditioning circuit 22. Further, this condition will always persist for a sufficiently long period of time that pulse train decoder 24 has sufficient time to recognize a valid permissible code sequence from two or more successively received sequences. In addition, the carrier-to-pulse conditioning circuit 22 ensures that each cycle of a burst of valid carrier frequency signals is reliably detected, and that the termination of a burst of valid carrier frequency signals is faithfully reflected in the binary pulse train generated from the sequence of valid encoded carrier frequency bursts.

While the above provides a full and complete disclosure of the preferred embodiments of the invention, various modifications, alternate constructions and equivalents will occur to those skilled in the art. For example, while the invention has been described with reference to a specific carrier frequency, other carrier frequencies can be employed depending on the requirements of a particular application. In such cases, the time constants of the charging resistor 35-capacitor 36 combination, as well as the R-C network 39, may be changed to match the timing parameters of the different frequencies. In addition, different maximum permitted amplitude values for variable gain amplifier 16 and different trigger threshold values for carrier-to-pulse conditioning circuit 22 may be selected, depending on the requirements of particular applications, especially when other supply voltage values are required. Further, different circuit components may be employed, such as those specifically described with reference to variable gain amplifier 16 and pulse train decoder 24. Therefore, the above should not be construed as limiting the invention, which is defined by the appended claims.

What is claimed is:

1. An automatic vehicle identification (AVI) receiver for processing signals received thereby to recover information encoded in carrier frequency signals generated at a specific frequency by a transmitter and identifying an authorized vehicle, said receiver comprising:

an input terminal adapted to be coupled to an inductive loop defining a detection zone for receiving signals from the loop;

a filter unit coupled to said input terminal for permitting signals at said specific frequency present on said input terminal to pass therethrough and for substantially attenuating all other frequency components of signals present on said input terminal, said filter unit having an output;

a variable gain amplifier having an input coupled to said output of said filter unit for amplifying signals input thereto and for limiting the amplitude of signals amplified thereby to a maximum value, said variable gain amplifier having a gain control signal input and an output, said variable gain amplifier having an operating range with a linear portion;

an amplitude detection circuit having an input coupled to said output of said variable gain amplifier and a gain control signal output coupled to said gain control input of said variable gain amplifier for sensing the amplitude of signals received from said variable gain amplifier and for generating a gain control signal for controlling the gain of said variable gain amplifier so that the signals input to said variable gain amplifier are operated on within said linear portion and the amplitude of signals amplified by said variable gain amplifier are limited to said maximum value; and a carrier-to-pulse conditioning circuit having an input coupled to said output of said variable gain amplifier for converting carrier frequency signals present at the output of said variable gain amplifier to a binary pulse train signifying the temporal length of each active carrier period and the temporal length of each quiescent carrier period, said carrier-to-pulse conditioning circuit having an output.

2. The receiver of claim 1 wherein said filter unit comprises a multi-stage tuned filter circuit having a narrow pass band centered on said specific carrier frequency.

3. The receiver of claim 1 wherein said maximum value is less than the supply voltage for said receiver.

4. The receiver of claim 1 wherein said maximum value lies within the linear operating portion of said variable gain amplifier.

5. The receiver of claim 1 wherein said gain control signal generated by said gain control circuit enables said variable gain amplifier to operate at maximum gain in the absence of any carrier frequency signals input thereto.

6. The receiver of claim 1 wherein said carrier-to-pulse conditioning circuit includes biasing means for establishing a trigger threshold for input carrier frequency signals, and binary level circuitry for establishing the signal on the output of said carrier-to-pulse conditioning circuit at a first binary level when the carrier frequency input signal rises above said trigger threshold at the beginning of an active carrier period and for establishing the signal on the output of said carrier-to-pulse conditioning circuit at a second binary level when the carrier frequency input signal falls below said trigger threshold at the end of an active carrier period.

7. The receiver of claim 6 wherein said binary level circuitry includes a first comparator having a first input coupled to said biasing means, a second input for receiving said input carrier frequency signals, and an output; a second comparator having a first input coupled to said output of said first comparator, a second input coupled to said biasing means, and an output; a switching transistor having a control input coupled to the output of said second comparator and an output element serving as the output of said carrier-to-pulse conditioning circuit; and an R-C circuit having a capacitor coupled between ground and said first input of said second comparator and a resistor coupled between said first input of said second comparator and supply voltage.

8. The receiver of claim 7 wherein said binary level circuitry further includes a second R-C circuit coupled between the output of said second comparator and said first input of said first comparator for preventing small carrier frequency noise signals from affecting the operation of said first comparator.

9. The receiver of claim 1 further including an amplifier coupled to the output of said variable gain amplifier for establishing a quiescent value for signals output from said variable gain amplifier.

10. A method of processing signals received by an automatic vehicle identification (AVI) receiver to recover information encoded in carrier frequency signals generated at a specific frequency by a transmitter and identifying an authorized vehicle, said method comprising the steps of:

(a) filtering signals received by the receiver to permit signals at said specific frequency to pass for further processing and for substantially attenuating all other frequency components of received signals;

(b) providing a reference supply voltage;

(c) processing the signals filtered in step (a) with a variable gain amplifier having an operating range with a linear portion to produce amplified carrier frequency signals operated on within the linear portion and having a maximum amplitude limited to a maximum value lower than the reference supply voltage; and (d) converting the amplified signals from step (c) to a binary pulse train signifying the temporal length of each active carrier period and the temporal length of each quiescent carrier period, said step (d) of converting including the steps of:

(i) establishing a first trigger threshold for carrier frequency signals amplified in step (c), and;

(ii) generating a binary signal at a first level when the amplified signal rises above the first trigger threshold at the beginning of an active carrier period and generating a binary signal at a second level when the amplified signal falls below the first trigger threshold at the end of an active carrier period.

11. The method of claim 10 further including the steps of:

(e) providing a permissible code sequence in the receiver and;

(f) generating an authorized vehicle signal when the binary signal train matches the permissible code sequence.

12. The method of claim 10 wherein said step (a) of filtering includes the step of passing the signals received by the receiver through a multi-stage tuned filter circuit having a narrow pass band centered on said specific carrier frequency.

13. The method of claim 10 wherein said step (c) of processing includes the step of enabling maximum gain amplification in the absence of any carrier frequency signals.

14. The method of claim 10 wherein the first trigger threshold is established at a value less than the value of the maximum amplitude.

15. The method of claim 10 wherein said step (ii) of generating includes the steps of initially charging a capacitor through a resistor coupled to the supply reference voltage, discharging the capacitor when the amplified signal rises above the first trigger threshold at the beginning of an active carrier period, permitting the capacitor to charge at a rate determined by the time constant of the resistor and capacitor, establishing a second trigger threshold, discharging the capacitor if the amplified signal again rises above the first trigger threshold before the capacitor is charged to the second trigger threshold, and generating the binary signal at the second level when the capacitor is charged to the second threshold level before the amplified signal rises above the first trigger threshold.

16. The method of claim 15 wherein the time constant of the resistor and capacitor is at least greater than the time length of one cycle of the amplified signal.

17. The method of claim 10 wherein said step (ii) of generating includes the step of preventing any small noise components present in the amplified signal from influencing the generation of the binary signal.

18. The receiver of claim 1 further including a decoder unit having an input coupled to the output of said carrier-to-pulse conditioning circuit for generating an authorized vehicle signal when the binary signal train matches a permissible code sequence contained in the decoder unit, said decoder unit having an output for manifesting said authorized vehicle signal.

19. A method of processing signals received by an automatic vehicle identification (AVI) receiver to recover information encoded in carrier frequency signals generated at a specific frequency by a transmitter and identifying an authorized vehicle, said method comprising the steps of:

(a) filtering signals received by the receiver to permit signals at said specific frequency to pass for further processing and for substantially attenuating all other frequency components of received signals;

(b) providing a reference D.C. supply voltage;

(c) processing the signals filtered in step (a) with a variable gain amplifier having a supply voltage input coupled to the reference D.C. supply voltage and an operating range with a linear portion to produce amplified carrier frequency signals operated on within the linear portion and having a maximum amplitude limited to a maximum value lower than the reference D.C. supply voltage; and (d) converting the amplified signals from step (c) to a binary pulse train signifying the temporal length of each active carrier period and the temporal length of each quiescent carrier period.

20. The method of claim 19 further including the steps of:

(e) providing a permissible code sequence in the receiver and;

(f) generating an authorized vehicle signal when the binary signal train matches the permissible code sequence.

21. The method of claim 19 wherein said step (a) of filtering includes the step of passing the signals received by the receiver through a multi-stage tuned filter circuit having a narrow pass band centered on said specific carrier frequency.

22. The method of claim 19 wherein said step (c) of processing includes the step of enabling maximum gain amplification in the absence of any carrier frequency signals.

* * * * *